United States Patent
Bucher

(10) Patent No.: US 10,575,442 B2
(45) Date of Patent: Feb. 25, 2020

(54) HEAT SINK ASSEMBLY FOR AN ELECTRICAL CONNECTOR

(71) Applicant: TE CONNECTIVITY CORPORATION, Berwyn, PA (US)

(72) Inventor: Alan Weir Bucher, Manheim, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 56 days.

(21) Appl. No.: 16/028,548

(22) Filed: Jul. 6, 2018

(65) Prior Publication Data

US 2020/0015385 A1  Jan. 9, 2020

(51) Int. Cl.
| | |
|---|---|
| *H05K 7/20* | (2006.01) |
| *G06F 1/20* | (2006.01) |
| *H01R 12/71* | (2011.01) |
| *H01L 23/40* | (2006.01) |
| *H05K 9/00* | (2006.01) |
| *H05K 5/02* | (2006.01) |
| *H01R 13/6594* | (2011.01) |

(52) U.S. Cl.
CPC .......... *H05K 7/20418* (2013.01); *G06F 1/20* (2013.01); *H01L 23/4093* (2013.01); *H01R 12/716* (2013.01); *H01R 13/6594* (2013.01); *H05K 5/0286* (2013.01); *H05K 9/0016* (2013.01)

(58) Field of Classification Search
CPC ............. H01R 13/6594; H01R 12/716; H05K 5/0286; H05K 9/0016; H05K 7/20418; G06F 1/20; H01L 23/4093
See application file for complete search history.

(56) References Cited

U.S. PATENT DOCUMENTS

| | | | |
|---|---|---|---|
| 6,749,448 B2 | 6/2004 | Bright et al. | |
| 6,793,517 B2 | 9/2004 | Neer et al. | |
| 6,986,679 B1 | 1/2006 | Aronson et al. | |
| 7,625,223 B1 | 12/2009 | Fogg et al. | |
| 7,794,241 B2 | 9/2010 | Bright et al. | |
| 8,345,445 B2 | 1/2013 | Del Prete et al. | |
| 8,534,930 B1 | 9/2013 | Lima | |
| 8,599,559 B1 | 12/2013 | Morrison et al. | |
| 2003/0161108 A1* | 8/2003 | Bright ................. | G02B 6/4201 361/707 |
| 2010/0067196 A1* | 3/2010 | Costello ............... | H05K 5/0286 361/704 |

(Continued)

FOREIGN PATENT DOCUMENTS

CN  103384037 A  11/2013

OTHER PUBLICATIONS

Tyco Electronics; "Pluggable Input/Output Solutions" 2009; 4 pages.

(Continued)

*Primary Examiner* — Mukundbhai G Patel

(57) ABSTRACT

A heat sink assembly for a pluggable module having a housing includes a plurality of discrete heat sink members in thermal communication with more than one wall of the housing. The heat sink members transfer heat from the pluggable module to the surrounding environment. The heat sink assembly also includes a spring member configured to exert a force on the plurality of discrete heat sink members for forcing the heat sink members into thermal engagement with the housing.

16 Claims, 4 Drawing Sheets

(56) References Cited

U.S. PATENT DOCUMENTS

| | | | |
|---|---|---|---|
| 2013/0210269 A1* | 8/2013 | Neer | G02B 6/4246 |
| | | | 439/487 |
| 2013/0323963 A1* | 12/2013 | Morrison | H05K 7/20418 |
| | | | 439/487 |
| 2018/0248305 A1* | 8/2018 | Regnier | H05K 7/20509 |
| 2018/0368283 A1* | 12/2018 | Little | H05K 7/20336 |

OTHER PUBLICATIONS

Optical Internetworking Forum "Implementation Agreement for Thermal Interface Specification for Pluggable Optics Module" May 2015 ( 34 pages).

* cited by examiner

HEAT SINK ASSEMBLY FOR AN ELECTRICAL CONNECTOR

BACKGROUND OF THE INVENTION

The subject matter herein relates generally to a heat sink assembly, and more particularly, to a heat sink assembly for an electrical connector.

Electrical connector assemblies allow users of electronic equipment or external devices to transfer data to or communicate with other equipment and devices. Typically, electrical connector assemblies include a pluggable module that is received within a receptacle assembly, which includes a receptacle connector that removably connects to the pluggable module. The receptacle assembly includes a metal cage having an internal compartment that receives the pluggable module therein. The receptacle connector is held in the internal compartment of the cage for connection with the pluggable module as the pluggable module is inserted therein.

Electrical connector assemblies are generally constructed according to established standards for size and compatibility (e.g., Small Form-factor Pluggable (SFP), XFP, Quad Small Form-factor Pluggable (QSFP) or Micro Quad Small Form-factor Pluggable (MicroQSFP)). The XFP, QSFP, and MicroQSFP standards require that the module assemblies be capable of transmitting data at high rates, such as 28 gigabits per second. As the density, power output levels, and signal transmission rates increase, the circuitry within the module assemblies generates larger amounts of heat. The heat generated by the operation of these devices can lead to significant problems. For example, some pluggable modules may lose performance, or outright fail, if the core temperature of the module rises too high.

Known techniques used to control the temperature of individual devices include the use of heat sinks, heat pipes and fans. For instance, heat dissipation for pluggable modules can be accomplished by the use of a heat sink coupled to the top of the cage. The heat generated by the pluggable module is transferred by conduction with an upper surface of the module and the heat sink. However, the limited size of the interface between the heat sink and upper surface of the pluggable module significantly limits the ease of heat transfer. Additionally, variations in manufacturing and tolerances can result in cumbersome assembly and unreliable thermal contact at the interface between the heat sink and the cage and/or pluggable module.

Thus, there is a need for a heat sink assembly for electrical connector assemblies with an increased thermal interface area and reliable thermal contact.

BRIEF DESCRIPTION OF THE INVENTION

In one embodiment, a heat sink assembly for a pluggable module having a housing is provided that includes a plurality of discrete heat sink members in thermal communication with more than one wall of the housing. The plurality of discrete heat sink members transfer heat from the pluggable module to the surrounding environment. The heat sink assembly also includes a spring member configured to exert a force on the discrete heat sink members to urge the discrete heat sink members against the housing.

In another embodiment, a heat sink assembly for a pluggable module having a housing is provided that includes a first heat sink member with a first mating surface configured for mechanical and thermal engagement with a first portion of an interface of the housing, wherein the interface includes more than one wall of the housing. The heat sink assembly also includes a second heat sink member separate from the first heat sink member. The second heat sink member has a second mating surface configured for mechanical and thermal engagement with a second portion of the interface of the housing, wherein the first heat sink member and second heat sink member are configured to transfer heat from the pluggable module to the surrounding environment.

In a further embodiment, an electrical connector assembly is provided for a pluggable module having a housing with an upper wall, a lower wall, and sidewalls extending between the upper wall and lower wall. The electrical connector assembly includes a receptacle assembly having, an upper wall, a lower wall, sidewalls extending between the upper walls and lower wall, a front end, and an internal compartment, the front end being open to the internal compartment of the receptacle assembly, the internal compartment being configured to receive the pluggable module therein through the front end. The electrical assembly also includes a heat sink assembly coupled with more than one wall of the housing of the pluggable module. The heat sink assembly is configured for heat transfer from the pluggable module to the surrounding environment.

DETAILED DESCRIPTION OF THE INVENTION

Embodiments described herein include an electrical connector assembly having a pluggable module that is received within a receptacle assembly. The electrical connector assembly may have a variety of configurations as set forth herein. For example, the electrical connector assembly may be a Small Form-factor Pluggable (SFP), XFP, Quad Small Form-factor Pluggable (QSFP), Micro Quad Small Form-factor Pluggable (MicroQSFP) connector, and the like. The electrical connector assembly may be used to convey data signals from one electrical device to another, and more particularly to convey data signals at high frequencies, such as 28 gigabits per second (Gbs). The electrical connector assembly includes a heat sink assembly in thermal communication with the pluggable module and is configured to dissipate heat to the surrounding environment. The heat sink assembly may have a variety of configurations as set forth herein.

Figure 1:
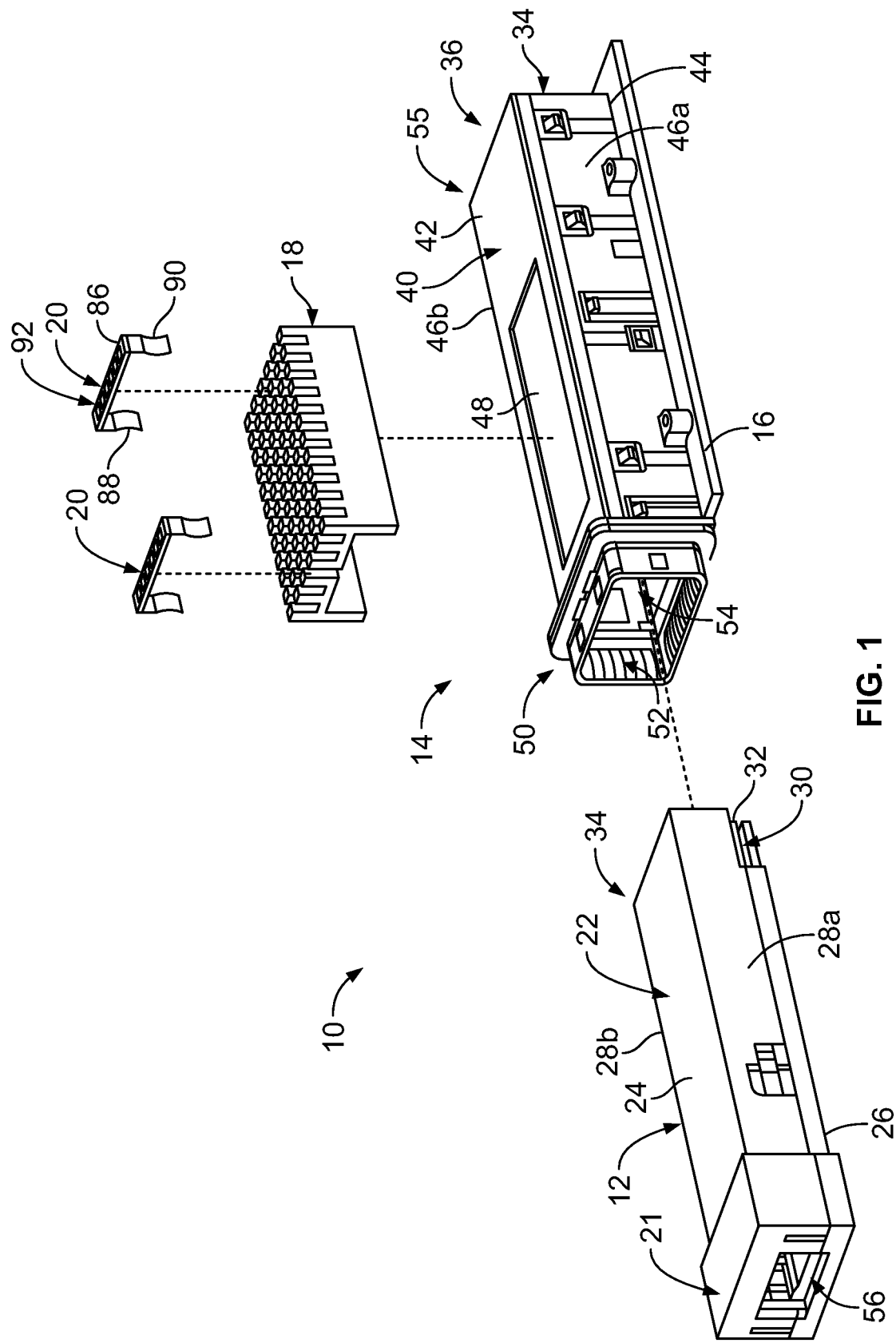
FIG. 1 illustrates a partially exploded perspective view of an electrical connector assembly according to an exemplary embodiment.
Figure 2:
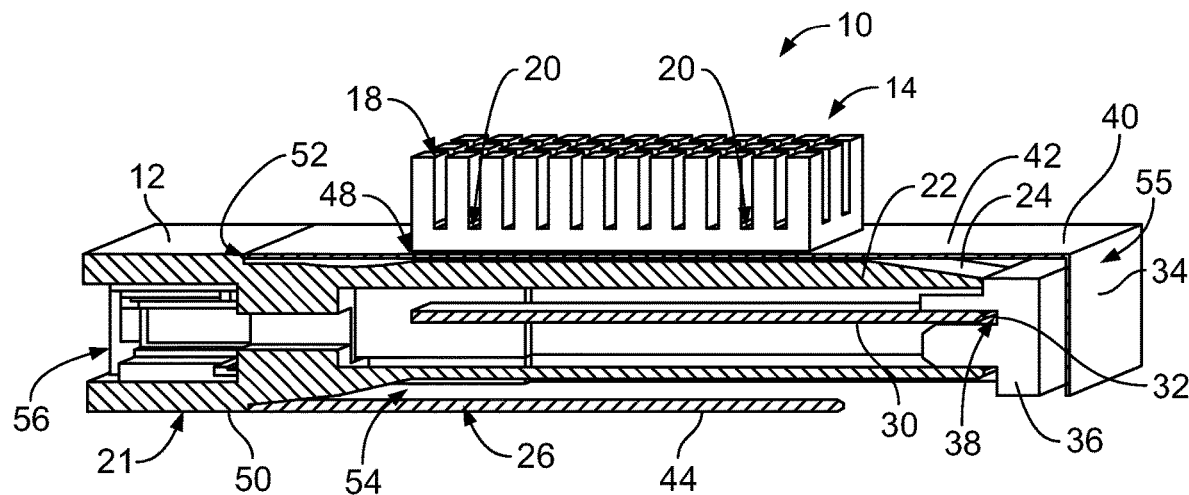
FIG. 2 illustrates a partial cross-section view of the electrical connector assembly according to an exemplary embodiment.

FIG. 1 is a partially exploded perspective view of an electrical connector assembly 10 according to an exemplary embodiment. FIG. 2 illustrates a partial cross-section view of the electrical connector assembly 10 according to an exemplary embodiment. The electrical connector assembly 10 is adapted to address, among other things, conveying data signals at high rates, such as data transmission rates of at least 10 gigabits per second (Gbps), which is required by the SFP+ standard. For example, in some embodiments the electrical connector assembly 10 is adapted to convey data signals at a data transmission rate of at least 28 Gbps. Moreover, and for example, in some embodiments the electrical connector assembly 10 is adapted to convey data signals at a data transmission rate of between approximately 20 Gbps and approximately 30 Gbps. It is appreciated, however, that the benefits and advantages of the subject matter described and/or illustrated herein may accrue equally to other data transmission rates and across a variety of systems and standards. In other words, the subject matter described and/or illustrated herein is not limited to data transmission rates of 10 Gbps or greater, any standard, or an exemplary type of electrical connector assembly shown and described herein.

The electrical connector assembly 10 includes one or more pluggable modules 12 configured for pluggable insertion into a receptacle assembly 14 that is mounted to a host circuit board 16. The host circuit board 16 may be mounted in a host system (not shown) such as, but not limited to, a router, a server, a computer, and/or the like. The host system typically includes a conductive chassis (not shown) having a panel (not shown) including one or more openings (not shown) extending therethrough in substantial alignment with the receptacle assembly 14. The receptacle assembly 14 is optionally electrically connected to the panel. The electrical connector assembly 10 includes a heat sink assembly 18 in thermal communication with the pluggable module 12. The electrical connector assembly 10 includes spring members 20 coupled to the heat sink assembly 18 and/or the receptacle assembly 14 to thermally couple the heat sink assembly 18 to the pluggable module 12. The heat sink assembly 18 is configured to transfer and dissipate heat from the pluggable module 12 to the surrounding environment.

The pluggable module 12 is configured for insertion into the receptacle assembly 14. Specifically, the pluggable module 12 inserts into the receptacle assembly 14 through the panel opening such that a front end 21 of the pluggable module 12 extends outwardly from the receptacle assembly 14. The pluggable module 12 includes a housing 22 having an upper wall 24, a lower wall 26, and first and second sidewalls 28a, 28b extending therebetween that form a protective shell for one or more circuit boards 30 disposed within the housing 22.

The circuit board 30 carries circuitry, traces, paths, devices, and/or the like that perform electrical connector functions in a known manner. An edge 32 of the circuit board 30 is exposed at a rear end 34 of the housing 22. A connector (not shown) may be mounted to the circuit board 30 and exposed at the rear end 34 of the housing 22 for plugging into a receptacle connector 36 (FIG. 2) of the receptacle assembly 14. Alternatively, the edges of the circuit board 30 of the pluggable module 12 may directly mate with the receptacle connector 36. In other words, in some embodiments, the edge 32 of the circuit board 30 of the pluggable module 12 is received within a corresponding receptacle 38 (shown in FIG. 2) of the receptacle connector 36 to electrically connect the pluggable module 12 to the receptacle connector 36.

In general, the pluggable module 12 and the receptacle assembly 14 may be used in any application requiring an interface for transmitting and receiving electrical and/or optical signals. The pluggable module 12 interfaces to the host system via the receptacle connector 36 of the receptacle assembly 14, which includes the receptacle connector 36 and an electrically conductive cage 40 (which is sometimes referred to as a "receptacle guide frame" or a "guide frame"). The cage 40 includes an upper wall 42, a lower wall 44, and first and second sidewalls 46a, 46b extending therebetween (FIG. 1). An opening 48 extends through the upper wall 42 of the cage 40 and is configured for receiving the heat sink assembly 18, which is discussed in more detail below. The cage 40 also includes a front end 50 having one or more front openings, or ports, 52 that are open to one or more internal compartments 54 of the cage 40. The front end 50 of the cage 40 is configured to be mounted, or received, within the opening in the panel of the host system. The receptacle connector 36 is positioned within the internal compartment 54 at a rear end 55 of the cage 40. The internal compartment 54 of the cage 40 is configured to receive the pluggable module 12 therein in electrical connection with the receptacle connector 36. The cage 40 may include any number of internal compartments 54 and ports 52, arranged in any pattern, configuration, arrangement, and/or the like (such as, but not limited to, any number of rows and/or columns), for electrically connecting any number of pluggable modules 12 to the host circuit board.

The pluggable module 12 interfaces to one or more optical cables (not shown) and/or one or more electrical cables (not shown) through a connector interface 56 at the front end 21 of the module 12. Optionally, the connector interface 56 comprises a mechanism that cooperates with a fiber or cable assembly (not shown) to secure the fiber or cable assembly to the pluggable module 12. Suitable connector interfaces 56 are known and include adapters for the LC style fiber connectors and the MTP/MPO style fiber connectors.

Figure 3:
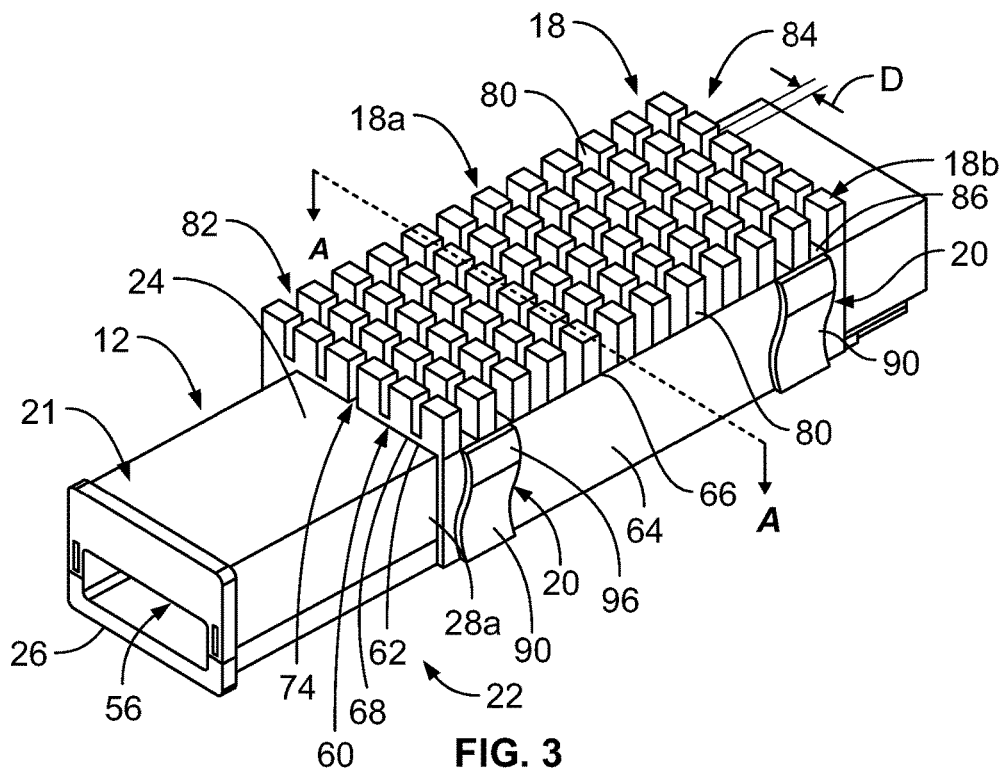
FIG. 3 illustrates a perspective view of a pluggable module with a heat sink assembly according to an exemplary embodiment.
Figure 4:
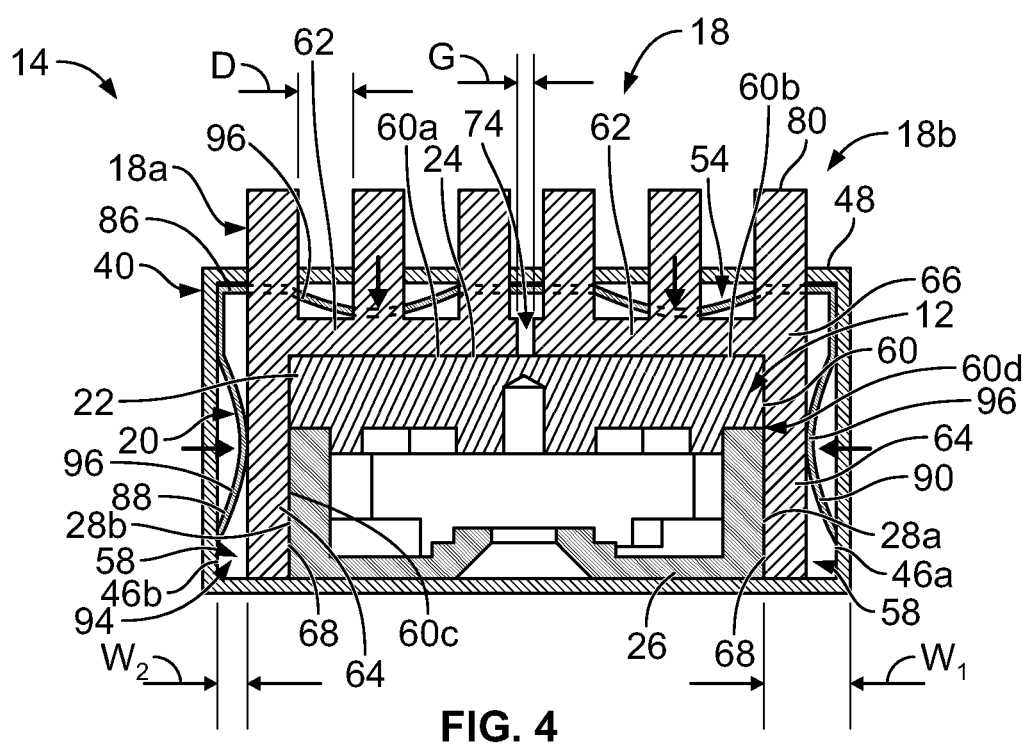
FIG. 4 illustrates a cross-section view taken along line A-A shown in FIG. 3 according to an exemplary embodiment.

FIG. 3 illustrates a perspective view of the pluggable module 12 with the heat sink assembly 18 according to an exemplary embodiment. FIG. 4 illustrates a cross-section view taken along line A-A shown in FIG. 3. The heat sink assembly 18 and the spring members 20 are located in the cage 40 between the pluggable module 12 and the walls of the cage 40. For example, the heat sink assembly 18 and the spring members 20 are located in channels 58 defined between the sidewalls 28a, 28b of the housing 22 and the sidewalls 46a, 46b of the cage 40. The channels 58 have a width $W_1$. The opening 48 of the cage 40 and channels 58 are configured to enable insertion of the heat sink assembly 18 therethrough into the internal compartment 54 to mechanically and thermally couple with an interface 60 of the pluggable module 12. In an exemplary embodiment, the heat sink assembly 18 and the spring members 20 are pre-loaded into the cage 40, such as through the opening 48, prior to loading the pluggable module 12 into the cage 40. In alternative embodiments, the pluggable module 12 may be loaded into the cage 40 prior to loading the heat sink assembly 18 and/or the spring members 20 into the cage 40. In an exemplary embodiment, the interface 60 may include multiple surfaces, such as the surfaces of the upper wall 24 and the sidewalls 28a, 28b of the housing 22, to provide a greater surface area and improve thermal transfer. In alternate embodiments, the interface 60 may include greater or lesser surfaces, such as the surface of the lower wall 26. Heat generated by the pluggable module 12 is transferred by the heat sink assembly 18 to the surrounding environment via the thermal communication between the heat sink assembly 18 and the pluggable module 12.

In an exemplary embodiment, the heat sink assembly 18 may include multiple discrete heat sink members (may be referred to hereinafter simply as members) that, responsive to being coupled with the interface 60 of the housing 22, provide for reliable thermal contact between the heat sink assembly 18 and the pluggable module 12. For example, the heat sink assembly 18 may include a first heat sink member 18a and an opposing second heat sink member 18b configured to mechanically and thermally couple with the interface 60 of the pluggable module 12. The interface 60 may include a first upper wall interface 60a, a second upper wall interface 60b, a first sidewall interface 60c, and a second sidewall interface 60d. Each heat sink member 18a, 18b is generally L-shaped having a base 62 and a leg 64 extending at a substantially right angle from an edge 66 of the base 62 to form a mating surface 68 configured to mate or engage with the interface 60 of the housing 22. For example, the mating surface 68 of the first heat sink member 18a may seat against a first upper wall interface 60a of the upper wall 24 and the first sidewall interface 60c of the sidewall 28b of the pluggable module 12, and the mating surface 68 of the second heat sink member 18b may seat against a second upper wall interface 60b of the upper wall 24 and the second sidewall interface 60d of the sidewall 28a of the pluggable module 12. When coupled with the interface 60, the first member 18a is separated from the second member 18b by a gap 74, having a width G, along the longitudinal axis of the pluggable module 12. Alternatively, the edges of the first and second members 18a, 18b may include a series of alternating rows of teeth and slots. The gap 74 provides for a reliable mating and thermal contact between the first member 18a, the second member 18b and the interface 60, even with variances or defects that may occur during the manufacturing process of the housing 22 and/or the heat sink assembly 18. Although an exemplary embodiment shows the leg 64 positioned at a substantially right angle relative to the base 62, alternate embodiments may have the leg 64 positioned at any angle that provides for reliable thermal contact between the leg 64 and the interface 60 of the housing 22.

Each heat sink member 18a, 18b may include heat dissipating elements 80 configured to increase the effective surface area and/or rate of heat transfer to the surrounding environment. In an exemplary embodiment, the heat dissipating elements 80 may include an array of rectangular prisms extending at a substantially right angle from the base 62. As shown in FIG. 3, each member 18a, 18b defines three (3) longitudinal rows of twelve (12) heat dissipating elements 80 evenly spaced apart at a distance D. However, the heat dissipating elements 80 may be any configuration, arrangement, and/or pattern, including any number of rows or columns. Optionally, the heat dissipating elements 80 may define any size or shape effective for dissipating heat, including but not limited to, fins, pins, heat pipe, elliptical, cylindrical, conical, and the like, or any combination thereof. Optionally, the legs 64 may also include heat dissipating elements (not shown).

The heat sink assembly 18 may be die-cast, molded, or otherwise formed from a thermally conductive material, such as aluminum, copper, metal alloys, composite materials, and the like. Optionally, the heat sink assembly 18 may be formed from a material that limits or prevents the transmission of EMI and/or electromagnetic radiation from the housing 22. For example, the heat sink assembly 18 may be manufactured from a material having high electromagnetic radiation absorbing characteristics, such as, a low magnetic permeability factor or a low electric permittivity factor. In some alternative embodiments, a thermal interface material (not shown) may be positioned along the interface 60 to increase the thermal transfer efficiency between the pluggable module 12 and the heat sink assembly 18. Although the heat sink assembly 18 is illustrated as having multiple discrete sections or members, in alternate embodiments the heat sink assembly may be a unitary member.

As can be seen in FIGS. 3-4, in an exemplary embodiment, the heat sink assembly 18 is biased into thermal contact with the pluggable module 12 using the spring members 20. As shown in FIG. 3, the spring members 20 may be positioned proximate to a front end 82 and a rear end 84 of the heat sink assembly 18. However, alternate embodiments may include any number of spring members 20, including one, located at any position along the heat sink assembly 18. In an exemplary embodiment, the spring members 20 are spring clips having a body 86 (also shown in FIG. 1) extending between a pair of opposite end portions 88, 90 (FIG. 4). In an exemplary embodiment, the body 86 includes spring elements configured to be spring biased against the heat sink assembly 18. The spring elements exert a compression force between the cage 40 and the heat sink assembly 18 to ensure pressure between the heat sink members 18a, 18b and the pluggable module 12 for reliable thermal contact and thermal transfer. In an exemplary embodiment, the end portions 88 and 90 include spring elements configured to be spring biased against the heat sink assembly 18. The spring elements exert a compression force between the cage 40 and the heat sink assembly 18 to ensure pressure between the heat sink members 18a, 18b and the pluggable module 12 for reliable thermal contact and thermal transfer. Spring members 20, can also be configured to apply forces on the housing 22 from opposing sides without exerting a forces against the cage 40 in various embodiments.

The body 86 defines a plurality of openings 92 (FIG. 1) configured to receive corresponding heat dissipating elements 80 therethrough. Alternatively, the body 86 may fit between rows of the heat dissipating elements 80, rather than having openings. Each end portion 88, 90 is configured for insertion into a channel 94, having a width $W_2$, which is defined as the space between the legs 64 of the heat sink assembly 18 and the sidewalls 46a, 46b of the cage 40. Alternate embodiments may include channels 94 at any location between the heat sink assembly 18 and the cage 40. The end portions 88, 90 exert a compression force against the legs 64 to ensure pressure between the heat sink members 18a, 18b and the housing 22 for reliable thermal contact and thermal transfer. The end portions 88, 90 force the legs 64 inward against the sidewalls 28a, 28b of the pluggable module 12. Responsive to the pluggable module 12 being inserted into the receptacle assembly 14, the arcuate portions 96 respond to the legs 64 moving apart, which produces forces that ensure pressure between the heat sink members 18a, 18b and the housing 22 for reliable thermal contact and thermal transfer. Optionally, the body 86 may also include arcuate portions 96 that generally push downward against the upper wall 24 of heat sink assembly 18. The arcuate portions 96 define spring elements that urge the heat sink members 18a, 18b into thermal contact with the pluggable module 12. The spring members 20 may be stamped and formed from any suitable material, such as, spring steel. Optionally, the spring members 20 may include structure to secure the heat sink assembly 18 in the receptacle assembly, including but not limited to adhesive, push pins, fasteners, tape, a latch, and the like.

Figure 5:
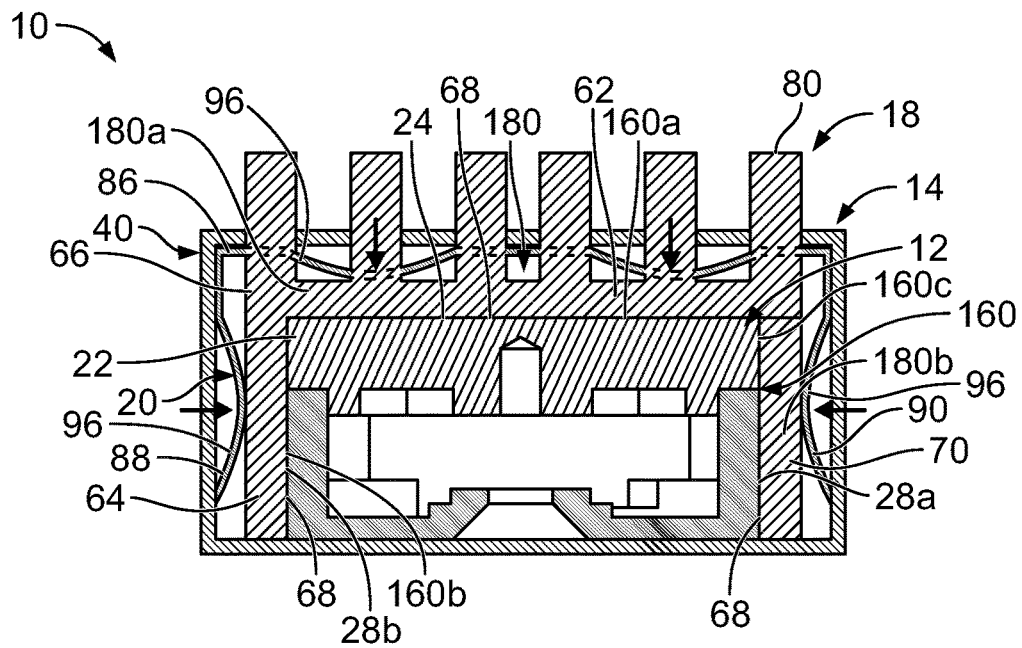
FIG. 5 illustrates a cross-section view of the electrical connector assembly according to an alternate exemplary embodiment.

FIG. 5 illustrates a cross-section view of the electrical connector assembly 10 according to an alternate exemplary embodiment. In an exemplary embodiment, the electrical connector assembly 10 is identical to the embodiment of FIG. 4 except for the configuration of the heat sink assembly 180. As shown in FIG. 5, the heat sink assembly 180 may include multiple discrete sections or members that, responsive to being coupled with an interface 160 of the housing 22, provide for reliable thermal contact between the heat sink assembly 180 and the pluggable module 12. For example, the heat sink assembly 180 may include a first member 180a and a second member 180b configured to mechanically and thermally couple with the interface 160 of the pluggable module 12. Member 180a is generally L-shaped having a base 62 and a leg 64 extending at a substantially right angle from an edge 66 of the base 62 to form a mating surface 68 configured to mate or engage with an upper wall interface 160a of the housing upper wall 24, and a first sidewall interface 160b of the sidewall 28b. Member 180b is a generally planar panel forming a leg 70 configured to mate or engage with a second sidewall interface 160c of the housing 22. For example, the mating surface 68 of the first member 180a may sit against the first upper interface 160a of the upper wall 24 and the first sidewall interface 160b of the first sidewall 28b of the pluggable module 12, and the mating surface 68 of the second member 180b may sit against the second sidewall interface 160c of the second sidewall 28a of the pluggable module 12. When coupled with the interface 160, the first member 180a is separated from the second member 180b which provides for a reliable mating and thermal contact between the first member 180a, the second member 180b and the interface 160, even with variances or defects that may occur during the manufacturing process of the housing 22 and/or the heat sink assembly 180. For example, the second member 180b may be variably positionable relative to the first member 180a, such as to accommodate tolerances in the size of the cage 40 and/or the pluggable module 12. In various embodiments, the edges of the first and second members 180a, 180b may include a series of alternating rows of teeth and slots. Although an exemplary embodiment shows the leg 64 positioned at a substantially right angle relative to the base 62, alternate embodiments may have the leg 64 positioned at any angle that provides for reliable thermal contact between the leg 64 and the interface 160 of the housing 22.

The heat sink member 180a may include heat dissipating elements 80 configured to increase the effective surface area and/or rate of heat transfer or dissipation to the surrounding environment. In an exemplary embodiment, the heat dissipating elements 80 may include an array of rectangular prisms extending at a substantially right angle from the base 62. As shown in FIG. 5 and similar to the heat sink assembly 18 shown in FIG. 3, member 180a, defines three (3) longitudinal rows of twelve (12) heat dissipating elements 80 evenly spaced apart at a distance D. However, the heat dissipating elements 80 may be any configuration, arrangement, and/or pattern, including any number of rows or columns. Optionally, the heat dissipating elements 80 may define any size or shape effective for dissipating heat, including but not limited to, fins, pins, heat pipe, elliptical, cylindrical, conical, and the like, or any combination thereof.

The heat sink assembly 180 may be die-cast, molded, or otherwise formed from a thermally conductive material, such as aluminum, copper, metal alloys, composite materials, and the like. Optionally, the heat sink assembly 180 may be formed from a material that limits or prevents the transmission of EMI and/or electromagnetic radiation from the housing 22. For example, the heat sink assembly 180 may be manufactured from a material having high electromagnetic radiation absorbing characteristics, such as, a low magnetic permeability factor or a low electric permittivity factor. In some alternative embodiments, a thermal interface material (not shown) may be positioned along the interface 160 to increase the thermal transfer efficiency between the pluggable module 12 and the heat sink assembly 180.

Similar to the embodiment of FIG. 4, the heat sink assembly 180 is biased into thermal contact with the pluggable module 12 using one or more of the spring members 20 which may be positioned proximate to a front end 82 and a rear end 84 of the heat sink assembly 180. However, alternate embodiments may include any number of spring members 20, including one, located at any position along the heat sink assembly 180. In an exemplary embodiment, the spring members 20 are spring clips having a body 86 extending between a pair of opposite end portions 88 and 90. The end portions 88, 90 exert a compression force against the legs 64, 70 of the heat sink assembly 180 to ensure pressure between the legs 64, 70 of the heat sink members 180a, 180b and the housing 22 for reliable thermal contact and thermal transfer. The end portions 88, 90 force the legs 64, 70 of the heat sink assembly 180 inward against the sidewalls 28b, 28a of the pluggable module 12. Responsive to the pluggable module 12 being inserted into the receptacle assembly 14, arcuate portions 96 of the spring member 20 respond to the legs 64, 70 of the heat sink members 180a, 180b moving apart, which produces forces that ensure pressure between the legs 64, 70 and the housing 22 for reliable thermal contact and thermal transfer. Optionally, the body 86 may also include arcuate portions 96 that generally push downward against the upper wall 66 of heat sink member 180a. The arcuate portions 96 define spring elements that urge the heat sink assembly 180 into thermal contact with the pluggable module 12.

Figure 6:
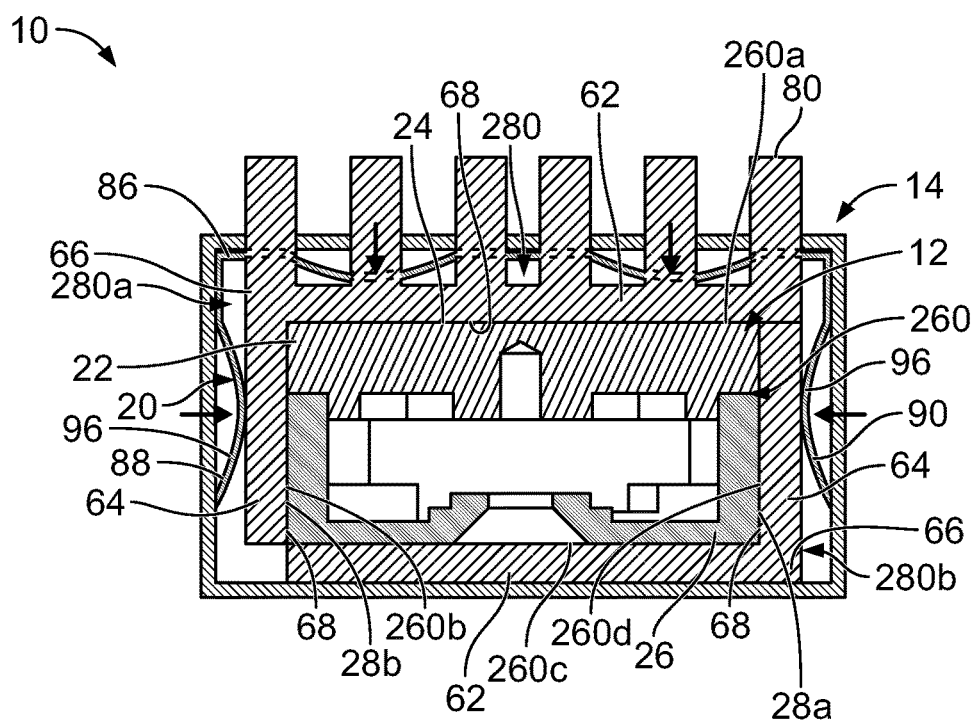
FIG. 6 illustrates a cross-section view of the electrical connector assembly according to another alternate exemplary embodiment.

FIG. 6 illustrates a cross-section view of the electrical connector assembly 10 according to another alternate exemplary embodiment. In an exemplary embodiment, the electrical connector assembly 10 is identical to the embodiment of FIG. 4 except for the configuration of the heat sink assembly 280. As shown in FIG. 6, the heat sink assembly 280 may include multiple discrete sections or members that, responsive to being coupled with an interface 260 of the housing 22, provide for reliable thermal contact between the heat sink assembly 280 and the pluggable module 12. For example, the heat sink assembly 280 may include a first member 280a and a second member 280b configured to mechanically and thermally couple with the interface 260 of the pluggable module 12. Each member 280a, 280b is generally L-shaped having a base 62 and a leg 64 extending at a substantially right angle from an edge 66 of the base 62 to form a mating surface 68 configured to mate or engage with the interface 260 of the housing 22. For example, the mating surface 68 of the first member 280a may sit against an upper wall interface 260a of the upper wall 24 and a first sidewall interface 260b of the first sidewall 28b of the pluggable module 12, and the mating surface 68 of the second member 280b may sit against a lower wall interface 260c of the lower wall 26 and a second sidewall interface 260d of the second sidewall 28a of the pluggable module 12. When coupled with the interface 260, the first member 280a is separated from the second member 280b which provides for a reliable mating and thermal contact between the first member 280a, the second member 280b and the interface 260, even with variances or defects that may occur during the manufacturing process of the housing 22 and/or the heat sink assembly 280. Although an exemplary embodiment shows the leg 64 positioned at a substantially right angle relative to the base 62, alternate embodiments may have the leg 64 positioned at any angle that provides for reliable thermal contact between the leg 64 and the interface 260 of the housing 22. The first and the second members may be inserted into the receptacle assembly 14 prior to insertion of the pluggable module 12.

The heat sink member 280a may include heat dissipating elements 80 configured to increase the effective surface area and/or rate of heat transfer or dissipation to the surrounding environment. In an exemplary embodiment, the heat dissipating elements 80 may include an array of rectangular prisms extending at a substantially right angle from the base 62. As shown in FIG. 6 and similar to the heat sink shown in FIG. 3, member 280a, defines three (3) longitudinal rows of twelve (12) heat dissipating elements 80 evenly spaced apart at a distance D. However, the heat dissipating elements 80 may be any configuration, arrangement, and/or pattern, including any number of rows or columns. Optionally, the heat dissipating elements 80 may define any size or shape effective for dissipating heat, including but not limited to, fins, pins, heat pipe, elliptical, cylindrical, conical, and the like, or any combination thereof.

The heat sink assembly 280 may be die-cast molded, or otherwise formed from a thermally conductive material, such as aluminum, copper, metal alloys, composite materials, and the like. Optionally, the heat sink assembly 280 may be formed from a material that limits or prevents the transmission of EMI and/or electromagnetic radiation from the housing 22. For example, the heat sink assembly 280 may be manufactured from a material having high electromagnetic radiation absorbing characteristics, such as, a low magnetic permeability factor or a low electric permittivity factor. In some alternative embodiments, a thermal interface material (not shown) may be positioned along the interface 260 to increase the thermal transfer efficiency between the pluggable module 12 and the heat sink assembly 280.

Similar to the embodiment of FIG. 4, the heat sink assembly 280 is biased into thermal contact with the pluggable module 12 using one or more of the spring members 20, which may be positioned proximate to a front end 82 and a rear end 84 of the heat sink assembly 280. However, alternate embodiments may include any number of spring members 20, including one, located at any position along the heat sink assembly 280. In an exemplary embodiment, the spring members 20 are spring clips having a body 86 extending between a pair of opposite end portions 88 and 90. The end portions 88, 90 exert a compression force against the legs 64 of the heat sink members 280a, 280b to ensure pressure between the legs 64 of the heat sink members 280a, 280b and the housing 22 for reliable thermal contact and thermal transfer. The end portions 88, 90 force the legs 64 of the heat sink assembly 280 inward against the sidewalls 28a, 28b of the pluggable module 12. Responsive to the pluggable module 12 being inserted into the receptacle assembly 14, arcuate portions 96 of the spring member 20 respond to the legs 64 of the heat sink members 280a, 280b moving apart, which produces forces that ensure pressure between the legs 64 and the housing 22 for reliable thermal contact and thermal transfer. Optionally, the body 86 may also include arcuate portions 96 that generally push downward against the base 62 of heat sink member 280a. The arcuate portions 96 define spring elements that urge the heat sink assembly 280 into thermal contact with the pluggable module 12. Arcuate portions may engage the base 62 of the heat sink member 280b.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. A heat sink assembly for a pluggable module having a housing, comprising:
   a plurality of discrete heat sink members including a first heat sink member having a first mating surface and a second heat sink member having a second mating surface configured to face more than one wall of the housing to place the first and second heat sink members in thermal communication with more than one wall of the housing, the first and second heat sink members being separated by a gap allowing the first and second heat sink members to move relative to each other for mating with the pluggable module, wherein the plurality of discrete heat sink members transfer heat from the pluggable module to the surrounding environment; and
   a spring member exerting a force on the plurality of discrete heat sink members for forcing the first and second heat sink members to move toward each other into thermal engagement with the housing.

2. The heat sink assembly of claim 1, wherein the plurality of discrete heat sink members includes a first heat sink member having a base configured for engagement with an upper wall of the pluggable module, and a leg extending from the base, the leg being configured for engagement with a first sidewall of the pluggable module.

3. The heat sink assembly of claim 2, wherein the plurality of discrete heat sink members includes a second heat sink member having a base configured for engagement with an upper wall of the pluggable module, and a leg extending from the base, the leg being configured for engagement with a second sidewall of the pluggable module.

4. The heat sink assembly of claim 1, wherein the plurality of discrete heat sink members includes an array of heat dissipating elements.

5. The heat sink assembly of claim 1, wherein the spring member includes a pair of end portions, and a body extending between the end portions, the body having a least one opening configured for receiving a heat dissipating element therethrough.

6. A heat sink assembly for a pluggable module having a housing, comprising:
- a first heat sink member having a first mating surface configured for mechanical and thermal engagement with a first portion of the housing, wherein the first mating interface is configured to engage more than one wall of the housing;
- a second heat sink member separate and discrete from the first heat sink member and being movable independently from the first heat sink member, the second heat sink member having a second mating surface configured for mechanical and thermal engagement with a second portion of the housing;
- a spring member configured to exert a force on the first heat sink member and the second heat sink member forcing the first and second heat sink members into thermal engagement with the housing; and
- wherein the first heat sink member and second heat sink member are configured to transfer heat from the pluggable module to the surrounding environment.

7. The heat sink assembly of claim 6, wherein the first heat sink member and second heat sink member are separated by a gap allowing the first heat sink member and the second heat sink member to move relative to each other for mating with the pluggable module.

8. The heat sink assembly of claim 6, wherein the first heat sink member comprises a base and a leg extending from an edge of the base at a substantially right angle.

9. The heat sink assembly of claim 6, wherein the first heat sink member comprises a base configured for engagement with an upper wall of the pluggable module, and a leg extending from the base, the leg being configured for engagement with a second wall of the pluggable module.

10. The heat sink assembly of claim 6, wherein the second heat sink member comprises a base configured for engagement with an upper wall of the pluggable module, and a leg extending from the base, the leg configured for engagement with a sidewall of the pluggable module.

11. The heat sink assembly of claim 6, wherein the first heat sink member includes an array of heat dissipating elements.

12. The heat sink assembly of claim 6, wherein the spring member includes a pair of end portions, and a body extending between the end portions, the body having a least one opening configured for receiving a heat dissipating element therethrough.

13. An electrical connector assembly for a pluggable module having a housing having an upper wall, a lower wall, and sidewalls extending between the upper wall and lower wall and having a mating end and an electrical component at the mating end, the electrical connector assembly comprising:
- a receptacle assembly having an upper wall, a lower wall, sidewalls extending between the upper wall and the lower wall, a front end, and an internal compartment, the front end being open to the internal compartment of the receptacle assembly, the internal compartment holding an electrical component, the internal compartment configured to receive the pluggable module therein through the front end such that the electrical component of the pluggable module is electrically connected to the electrical component of the receptacle assembly; and
- a heat sink assembly passing through an opening in the receptacle assembly to directly engage the pluggable module in the internal compartment, the heat sink assembly including a plurality of discrete heat sink members and a spring member exerting force against the heat sink members, the heat sink assembly being coupled with the upper wall of the housing of the pluggable module and the sidewalls of the housing of the pluggable module, the heat sink assembly being configured for heat transfer from the pluggable module to the surrounding environment; and
- a channel between the heat sink assembly and the receptacle assembly, the channel receiving the spring member.

14. The electrical connector assembly of claim 13, wherein the heat sink assembly includes a first heat sink member having a first mating surface configured for mechanical and thermal engagement with more than one wall of the housing; and a second heat sink member separate from the first heat sink member, the second heat sink member having a second mating surface configured for mechanical and thermal engagement with the housing.

15. The electrical connector assembly of claim 13, wherein the heat sink assembly is positioned between the sidewalls of the pluggable module and the sidewalls of the receptacle assembly.

16. The electrical connector assembly of claim 13, wherein the spring member includes an arcuate portion spring biased between the receptacle assembly and the heat sink assembly to press the heat sink assembly into thermal engagement with the pluggable module.

* * * * *